(12) United States Patent
Coimbra et al.

(10) Patent No.: US 10,712,210 B2
(45) Date of Patent: Jul. 14, 2020

(54) SELF-REFERENCED, HIGH-ACCURACY TEMPERATURE SENSORS

(71) Applicant: NXP USA, INC., Austin, TX (US)

(72) Inventors: Ricardo Pureza Coimbra, Campinas (BR); Edevaldo Pereira da Silva, Jr., Campinas (BR)

(73) Assignee: NXP USA, Inc., Austin, TX (US)

( * ) Notice: Subject to any disclaimer, the term of this patent is extended or adjusted under 35 U.S.C. 154(b) by 267 days.

(21) Appl. No.: 15/859,079

(22) Filed: Dec. 29, 2017

(65) Prior Publication Data

US 2019/0204164 A1    Jul. 4, 2019

(51) Int. Cl.
*G01K 7/01* (2006.01)
*G01K 7/25* (2006.01)
*G01K 1/14* (2006.01)
*H03K 17/60* (2006.01)

(52) U.S. Cl.
CPC ............... *G01K 7/25* (2013.01); *G01K 1/14* (2013.01); *G01K 7/01* (2013.01); *G01K 2219/00* (2013.01); *H03K 17/602* (2013.01); *H03K 2217/0027* (2013.01)

(58) Field of Classification Search
CPC ............ G01K 7/01; G01K 13/00; G01K 7/00; G01K 7/16; G01K 7/425; G01K 2217/00; G05F 3/02; H01L 2924/1305; G01N 27/002
See application file for complete search history.

(56) References Cited

U.S. PATENT DOCUMENTS

| | | | | |
|---|---|---|---|---|
| 3,851,241 A | * | 11/1974 | Wheatley, Jr. | G01K 7/01 323/226 |
| 5,519,354 A | * | 5/1996 | Audy | G05F 3/265 307/651 |
| 5,838,578 A | * | 11/1998 | Pippin | G06F 1/206 327/512 |
| 5,961,216 A | * | 10/1999 | Quinn | A45C 13/02 190/2 |
| 5,982,221 A | * | 11/1999 | Tuthill | G01K 7/01 257/E23.08 |

(Continued)

OTHER PUBLICATIONS

Pertijs et al., "A CMOS Smart Temperature Sensor With a 3[sigma] Inaccuracy," IEEE Journal of Solid-State Circuits, Dec. 2005, pp. 2805-2815, vol. 40, No. 12.

*Primary Examiner* — Gail Kaplan Verbitsky

(57) ABSTRACT

A sensor may include: a first plurality of resistors; a first BJT having: a first base terminal, a collector terminal, and an emitter terminal, where the collector terminal is coupled to the first plurality of resistors; and a first amplifier having a first non-inverting input coupled to the collector terminal and an output terminal coupled to the base terminal. The sensor may include: a second plurality of resistors; a second BJT having: a base terminal, a collector terminal, and an emitter terminal, where the base terminal is coupled to the base terminal of the first BJT, where the collector terminal is coupled to the second plurality of resistors; and a second amplifier having an inverting input coupled to the collector terminal and an output terminal coupled to the emitter terminal, wherein the inverting input terminal of the first amplifier is coupled to a non-inverting input terminal of the second amplifier.

20 Claims, 11 Drawing Sheets

(56) References Cited

U.S. PATENT DOCUMENTS

| | | | | |
|---|---|---|---|---|
| 6,019,508 A * | 2/2000 | Lien | ................ | G01K 7/01 |
| | | | | 327/512 |
| 6,121,824 A * | 9/2000 | Opris | ................ | G01K 7/01 |
| | | | | 323/313 |
| 6,733,174 B2 * | 5/2004 | Matsumoto | ............ | G01K 7/01 |
| | | | | 374/178 |
| 7,821,320 B2 * | 10/2010 | Ueda | ................ | G01K 7/20 |
| | | | | 327/512 |
| 8,378,735 B2 | 2/2013 | Pereira Da Silva, Jr. et al. | | |
| 8,475,039 B2 * | 7/2013 | Chern | ................ | G01K 7/01 |
| | | | | 374/170 |
| 9,310,261 B2 | 4/2016 | Coimbra et al. | | |
| 9,506,817 B2 * | 11/2016 | Qiu | ................ | G01K 7/01 |
| 2004/0083075 A1 * | 4/2004 | Fan | ................ | G01K 7/01 |
| | | | | 702/129 |
| 2007/0158776 A1 * | 7/2007 | Julio | ................ | G01K 7/01 |
| | | | | 257/486 |
| 2013/0301680 A1 * | 11/2013 | Qiu | ................ | G01K 7/01 |
| | | | | 374/184 |
| 2014/0119405 A1 | 5/2014 | Coimbra et al. | | |
| 2015/0117495 A1 * | 4/2015 | Tiruvuru | ............ | G01K 7/006 |
| | | | | 374/178 |
| 2018/0328792 A1 * | 11/2018 | Zhu | ................ | G01K 7/34 |
| 2019/0154518 A1 * | 5/2019 | Takeuchi | ............ | G01K 7/01 |

\* cited by examiner

SELF-REFERENCED, HIGH-ACCURACY TEMPERATURE SENSORS

FIELD

This disclosure relates generally to integrated circuits, and more specifically, to systems and methods for measuring the die temperature of integrated circuits using self-referenced, high-accuracy temperature sensors.

BACKGROUND

In semiconductor design, the operating characteristics of integrated circuits are commonly temperature dependent. It is generally required to characterize, validate, and/or calibrate a set of product specifications in respect to the die temperature. This requires some procedure to measure die temperature during test with appropriate accuracy.

As the inventors hereof have recognized, to perform high-precision temperature-related specifications, a highly-accurate method to measure die temperature is needed.

Solutions based on external temperature sensors, such as thermocouples, commonly provide poor measurement accuracy of die temperature and long measurement delays, typically worse than +/−7° C. This is mainly due to the significant thermal gradient between the measurement point of interest (silicon junction) and the sensor locus (outside package), This error is higher on System-on-Chip (SoC) products with high power dissipation. Solutions based on fully integrated temperature sensors are not sensitive to thermal gradients beyond the silicon interface, but are commonly limited by the complexity of the measurement and signal-conditioning circuitry that may be completely integrated.

Another factor that compromises the precision of internal temperature sensors is that their output is commonly accessible through a pad that is subject to leakage effect. Leakage currents will create signal offsets that result in measurement errors.

To address these, and other problems, the inventors hereof have recognized a need for providing the measurement of die temperature during factory tests (as a manufacturing resource). The inventors have also recognized a need for more accurate methods to measure die temperature in the field (as a customer feature). Accordingly, the inventors hereof have developed systems and methods for measuring the die temperature of integrated circuits using self-referenced, high-accuracy temperature sensors.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity and have not necessarily been drawn to scale.

DETAILED DESCRIPTION

Figure 1:
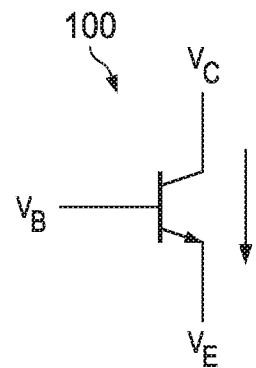
FIG. 1 is a diagram of a Bipolar Junction Transistor (BJT) illustrating a voltage applied to three regions, a collector region, a base region, and an emitter region.

Systems and methods for measuring the die temperature of integrated circuits using self-referenced, high-accuracy temperature sensors are disclosed. In various embodiments, these systems and methods may employ thermal properties of Bipolar Junction Transistors ("bipolar transistors" or "BJTs") to generate accurate temperature measurements. Several techniques may be employed to reduce or minimize the effects of error sources related to the BJT devices themselves (for example, due to BJT terminal resistance effects) and their surrounding biasing/conditioning circuitry (for example, due to device mismatch effects).

Systems and methods described herein may employ small-area circuit arrangements that are configurable through the control of internal switches. Each circuit configuration may generate a different output voltage. To perform a temperature measurement, the output voltage of each circuit configuration may be measured, and those values may be used to calculate the die temperature.

Techniques may be employed to minimize precision requirements for the voltage measurements themselves (conversion of analog voltage level into a digital code). This allows the voltage outputs to be measured through an on-chip Analog-to-Digital Converter (ADC) of moderate precision (e.g., 12-bits). Moreover, techniques may be employed to minimize errors due to temperature drifting during measurements.

As such, in various embodiments, systems and methods described herein may, among other things, overcome problems related to: (1) the measurement of die temperature during factory-test and/or (2) in the field.

Regarding (1), it is generally necessary to measure die temperature during factory-tests, for example, to validate System-on-Chip (SoC) specifications and to calibrate circuits that depend on a determination of a die temperature value. Conventional methods that rely on measuring die temperature during test (or adjusting a test temperature) using external temperature sensors (e.g., thermocouples) produce low accuracy, especially when the integrate circuit's (IC's) self-heating is significant. Errors of several degrees may result due to large thermal gradients between silicon and the external medium.

In addition to an inability to accurately calibrate parameters that depend on die temperature value, poor test-temperature control may also reduce yield. In some cases, parts may end up being tested at temperatures beyond the limits specified, for example, due to errors in test temperature adjustment, thus leading to higher number of parts failing or being rejected. In other cases, parts end up being tested at temperatures that did not reach the limits specified (e.g., due to error in test temperature adjustment), which results in parts being sent to customers that would have otherwise been rejected had tests been performed with the correct temperature range.

Regarding (2), the ability to accurately measure die temperature is a frequent customer request serving an extensive range of applications. Customers generally have a large interest on temperature solutions that provide high accuracy at a minimum added cost.

Systems and methods described herein may provide a very low cost and yet highly-accurate temperature sensor solution. The low-cost is due to a negligible factory-test cost (minimum test-time, simple test resources, etc.), as well as a small silicon footprint.

Die temperature may be sensed using an integrated temperature sensing structure. The integrated temperature sensing structure may be placed at a point of interest (i.e., a specific location on the die) and is insensitive to thermal gradients between the silicon and the external medium. Moreover, techniques described herein may eliminate main sources of error related to die temperature measurement. As such, embodiments of systems and methods disclosed herein may measure die temperature with very high precision during factory test.

Embodiments of systems and methods disclosed herein may employ BJTs as die-temperature sensing structures. These systems and methods may measure the junction temperature by: exciting a sequence of input signals to a BJT, observing the temperature-dependent output signals, and calculating the temperature from the relationship between these signals.

FIG. 1 is an example diagram of a conventional bipolar transistor (BJT) 100. Shown is a voltage $V_B$ applied at a base terminal, a voltage $V_C$ applied at a collector terminal, and a voltage $V_E$ applied at an emitter terminal of BJT 100.

Figure 2:
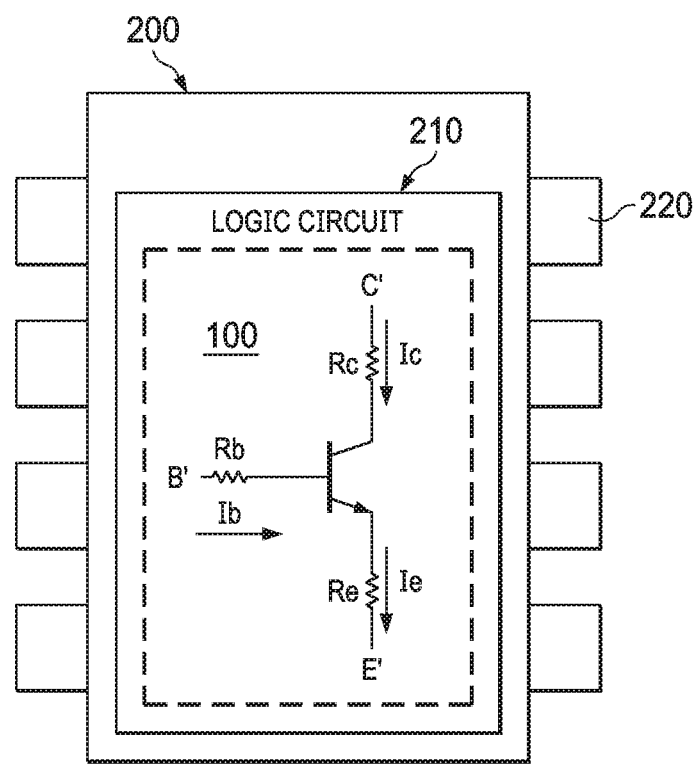
FIG. 2 is a diagram of a BJT employed as a temperature sensor within an integrated chip according to some embodiments.

FIG. 2 is a diagram of BJT 100 employed as a die temperature sensor element within integrated circuit (IC) 200 according to some embodiments. In many embodiments, IC 200 herein may be incorporated into a wide range of electronic devices including, for example, computer systems or Information Technology (IT) products such as servers, desktops, laptops, memories, switches, routers, etc.; telecommunications hardware; consumer devices or appliances such as mobile phones, tablets, television sets, cameras, sound systems, etc.; scientific instrumentation; industrial robotics; medical or laboratory electronics such as imaging, diagnostic, or therapeutic equipment, etc.; transportation vehicles such as automobiles, buses, trucks, trains, watercraft, aircraft, etc.; military equipment, etc.

More generally, IC 200 may be incorporated into any device or system having one or more electronic parts or components. As such, logic circuit 210 within IC 200 (e.g., a System-on-Chip, or "SoC") can take a number of forms (e.g., microprocessor, controller, etc.) and may be configured to execute a number of operations, including temperature sensing operations described herein, using one or more BJTs 100. As such, IC 200 may include, among other components, one or more Analog-to-Digital Converters (ADCs) configured to read an analog voltage value, for example, and to convert that value into a sampled, quantized, or digital value.

Still referring to FIG. 2, shown are the currents and the parasitic resistances for the collector terminal, the base terminal, and the emitter terminal along with eight I/O pads 220. Parasitic resistance is a resistance encountered in a circuit board or integrated circuit but not included in the original design. The parasitic resistance is generally an undesirable, unintended result of the manufacturing process.

The value of parasitic resistance may be estimated in order to make sure the circuit still functions as designed. Parasitic resistances comprise undesirable resistances related to the integrated circuit fabrication process. An example of parasitic resistance is the resistance of the traces in a circuit board or metal interconnects in an integrated circuit (IC), the purpose of which is to connect components electrically according to the circuit diagram, but these connecting structures are not ideal.

The parasitic resistances that affect the bipolar transistor may be lumped into rc, rb and re, which correspond to the collector parasitic resistance, the base parasitic resistance, and the emitter parasitic resistance, respectively. The parasitic resistances rc, rb and re, of the bipolar transistor typically include a diffusion resistance, a contact resistance and a routing resistance, as well. Also shown are the current flowing into the collector Ic, the current flowing into the base Ib, and the current flowing out of the emitter Ie.

A Proportional-To-the-Absolute-Temperature (PTAT) voltage signal may be generated by biasing two BJTs with different collector current densities and taking the difference between base-emitter voltages produced ($\Delta V_{BE}$). The difference between base-emitter voltages of transistors $Q_1$ and $Q_2$, of emitter areas $A_{E1}$ and $A_{E2}$, biased with collector currents $I_{C1}$ and $I_{C2}$, respectively, is given by:

$$\Delta V_{BE} = V_{BE1} - V_{BE2} = \frac{k}{q}\ln(N) \cdot T \quad \text{with} \qquad \text{Equation 1}$$

$$N = \frac{I_{C1}}{I_{C2}} \cdot \frac{A_{E2}}{A_{E1}}$$

where k is Boltzmann's constant, q is the electron charge, T is the absolute temperature measured in kelvin, and ln is the natural logarithmic function. Then, the junction temperature (T) may be found by measuring voltage signal $\Delta V_{BE}$ and calculating:

$$T = \frac{q}{k \cdot \ln(N)} \cdot \Delta V_{BE} \qquad \text{Equation 2}$$

Note that signal $\Delta V_{BE}$ has a thermal coefficient that only depends on physical constants and on the ratios of collector currents and emitter areas. Therefore, signal $\Delta V_{BE}$ is made PTAT by making the collector current ratio and consequently N constant. Signal $\Delta V_{BE}$ may normally present a relatively-low thermal coefficient value (e.g., 0.2 mV/K).

However, a method to extract die temperature based on the foregoing must be refined to avoid potential error sources. A significant error source which is commonly overlooked by design community is the effect of resistances between BJT device terminals and the junctions (e.g., contact and diffusion resistance). The "apparent" base-emitter voltage measured ($V_{B'E'}$) carries the effect of the RI drops that appear across those resistances:

$$V_{B'E'} = V_{BE} + R_b I_b + R_e I_E$$

$$\Rightarrow \Delta V_{B'E'} = \Delta V_{BE} + R_b(I_{b2}-I_{b1}) + R_e(I_{e2}-I_{e1}) \qquad \text{Equation 3}$$

In other words, Equation 3 describes $V_{B'E'}$ for an NPN BJT with terminal resistance effect included. In some embodiments, techniques described herein may be employed to cancel the effect of terminal resistances. Two or more $V_{B'E'}$ voltages may be produced for two or more currents, and those results may be combined to produce a $\Delta V_{BE}$ measurement with the effect of terminal resistances being cancelled out.

In some cases, $V_{B'E'}$ voltages may be measured for $I_C = I$, $2I$, $NI$ and $2NI$ with I and NI chosen such that the current gain variation ($\beta = I_C/I_B$) is negligible.

Then:

$$\begin{cases} V_{B'E'1} = R_b \frac{I_C}{\beta} + R_e\left(\frac{\beta+1}{\beta}\right)I_C + \frac{k}{q}\ln\left(\frac{I_C}{I_S}\right) \cdot T \\ V_{B'E'2} = R_b \frac{2I_C}{\beta} + R_e\left(\frac{\beta+1}{\beta}\right)2I_C + \frac{k}{q}\ln\left(\frac{2I_C}{I_S}\right) \cdot T \\ V_{B'E'N} = R_b \frac{NI_C}{\beta} + R_e\left(\frac{\beta+1}{\beta}\right)NI_C + \frac{k}{q}\ln\left(\frac{NI_C}{I_S}\right) \cdot T \\ V_{B'E'2N} = R_b \frac{2NI_C}{\beta} + R_e\left(\frac{\beta+1}{\beta}\right)2NI_C + \frac{k}{q}\ln\left(\frac{2NI_C}{I_S}\right) \cdot T \end{cases} \quad \text{Equation 4}$$

$$\Rightarrow T = \frac{q}{k\ln(N)} \cdot [2 \cdot (V_{B'E'N} - V_{B'E'1}) - (V_{B'E'2N} - V_{B'E'2})]$$

All VBE voltages may be produced by a single BJT. Note that all R terms are cancelled out by combining the $V_{B'E'}$ measurements in the form expressed above. At the cost of a smaller $\Delta V_{BE}$ thermal coefficient (assuming same min/max current limits), an alternative method is to generate $V_{BE}$ using only 3 currents. For example, using I, NI, and N2I:

$$\begin{cases} V_{B'E'1} = R_b \frac{I_C}{\beta} + R_e\left(\frac{\beta+1}{\beta}\right)I_C + \frac{k}{q}\ln\left(\frac{I_C}{I_S}\right) \cdot T \\ V_{B'E'N} = R_b \frac{NI_C}{\beta} + R_e\left(\frac{\beta+1}{\beta}\right)NI_C + \frac{k}{q}\ln\left(\frac{NI_C}{I_S}\right) \cdot T \\ V_{B'E'sqN} = R_b \frac{N^2I_C}{\beta} + R_e\left(\frac{\beta+1}{\beta}\right)N^2I_C + \frac{k}{q}\ln\left(\frac{N^2I_C}{I_S}\right) \cdot T \end{cases} \quad \text{Equation 5}$$

$$\Rightarrow T = \frac{q}{k\ln(N)} \cdot \frac{[N \cdot (V_{B'E'N} - V_{B'E'1}) - (V_{B'E'sqN} - V_{B'E'N})]}{(N-1)}$$

In light of the foregoing, embodiments of the systems and methods described herein are discussed below, ranging from the simplest (referred to as a "first configuration") to the most sophisticated (a "third configuration"); but this is to facilitate the reader's understanding only. A person of ordinary skill in the art will immediate recognize in light of this disclosure that various features of the various configuration and/or variations thereof may be combined or modified in order to reduce any selected error source(s).

Generally, these embodiments have been drawn assuming that the 4-current method is being used to cancel out terminal resistance effects, as previously discussed. As a person of ordinary skill in the art will immediate recognize in light of this disclosure, however, these same embodiments may be modified to use a 3-current method without any undue experimentation.

Figure 3:
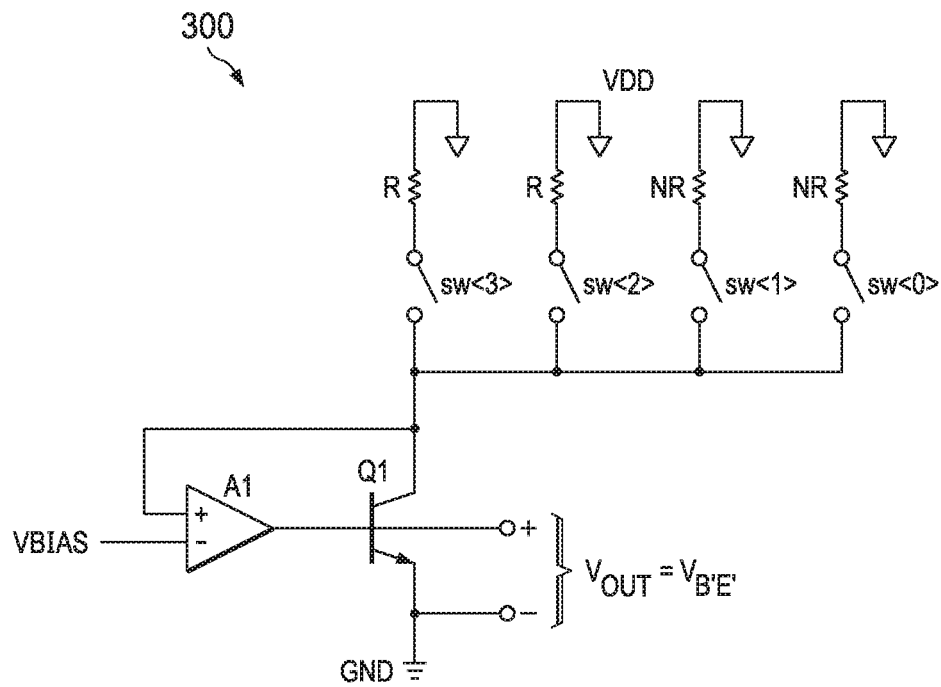
FIG. 3 is a schematic diagram of an example of a die temperature measurement circuit in a first configuration according to some embodiments.

FIG. 3 is a schematic diagram of an example of a die temperature measurement circuit 300 in a first configuration according to some embodiments. Particularly, circuit 300 includes a plurality of resistors R and NR, each coupled in series with respective switches, and those structures are arranged in parallel.

Bipolar Junction Transistor (BJT) Q1 has: a base terminal, a collector terminal, and an emitter terminal. The collector terminal is coupled to the plurality of resistors R and NR, the emitter terminal is coupled to a ground terminal GND, and each resistor is coupled to the collector terminal via a corresponding one of a plurality of corresponding switches sw<3>-<1>. Circuit 300 also includes amplifier A1 having a non-inverting input (+) coupled to the collector terminal of BJT Q1 and an inverting input (−) configured to receive a voltage bias Vbias. The output voltage Vout of circuit 300 is provided between the base terminal and the ground terminal of BJT Q1.

Referring back to FIG. 2, logic circuit 210 may be configured to determine a temperature of IC 200 using circuit 300, in part, based upon the values of output voltage Vout measured for the different collector current conditions and combined according to Equation 4 (4-current method) or Equation 5 (3-current method).

Particularly, using $I_{C\_un} = (V_{DD} - V_{bias})/(NR)$, circuit 300 may be programmatically configured in each of the four configurations below:

(1) sw<3:0>=4b'0001 to set $I_C = I_{C\_un}$ and measure $V_{B'E'1}$
(2) sw<3:0>=4b'0011 to set $I_C = 2I_{C\_un}$ and measure $V_{B'E'2}$
(3) sw<3:0>=4b'0100 to set $I_C = NI_{C\_un}$ and measure $V_{B'E'N}$
(4) sw<3:0>=4b'1100 to set $I_C = 2NI_{C\_un}$ and measure $V_{B'E'2N}$ A procedure to measure die temperature with circuit 300 is to sequentially set each circuit configuration (1)-(4), measure (and store) the $V_{B'E'}$ voltages produced, and then use Equation 5 to calculate die temperature.

However, some amount of error may arise as the effect of die temperature drifting (not perfectly stable) during the time of the measurement sequence. In some cases, the effect of the temperature drift may be cancelled in first-order by repeating the sequence of measurements in reverse-order and then averaging the results. The procedure's total time may be reduced, streamlined, or minimized to promote or guarantee a smaller or minimum temperature drift. It should be noted that the use of feature(s) of circuit 300 may be employed in combination with various other configurations described herein.

Still referring to FIG. 3, it can be shown that error contributions from amplifier A1 and switches sw<3>-<1> are strongly attenuated by a relatively large voltage drop across resistors R and resistors NR. Moreover, an option to further reduce error components related to the voltage drop across switches sw<3>-<1> is shown in FIG. 4 below.

Figure 4:
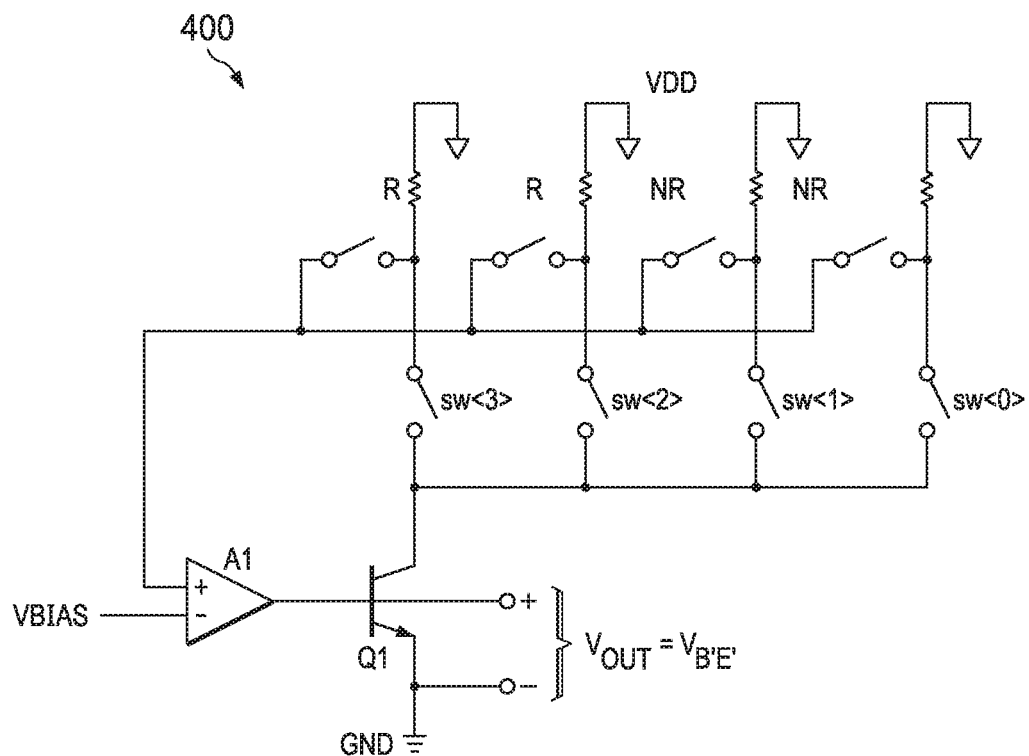
FIG. 4 is a schematic diagram of an example of a die temperature measurement circuit in the first configuration that reduces sensitivity to switch on-resistance according to some embodiments.

FIG. 4 is a schematic diagram of an example of die temperature measurement circuit 400 in the first configuration that reduces sensitivity to switch on-resistance. In some embodiments, another bank of switches between the plurality of resistors and the non-inverting input terminal of amplifier A1 may be used so that switches sw<3>-<1> now each represents two or more switches.

In circuit 400, extra switches were added to circuit 300 to eliminate sensitivity of collector current to voltage drop across the switches connected to Q1's collector terminal. This eliminates error contributions from their on-resistance mismatch relaxing on-resistance requirements. Ultimately, switches can be made smaller (higher on-resistances) having negligible effect on the output. It should be noted that the use of feature(s) of circuit 400 may be employed in combination with various other configurations described herein.

Figure 5:
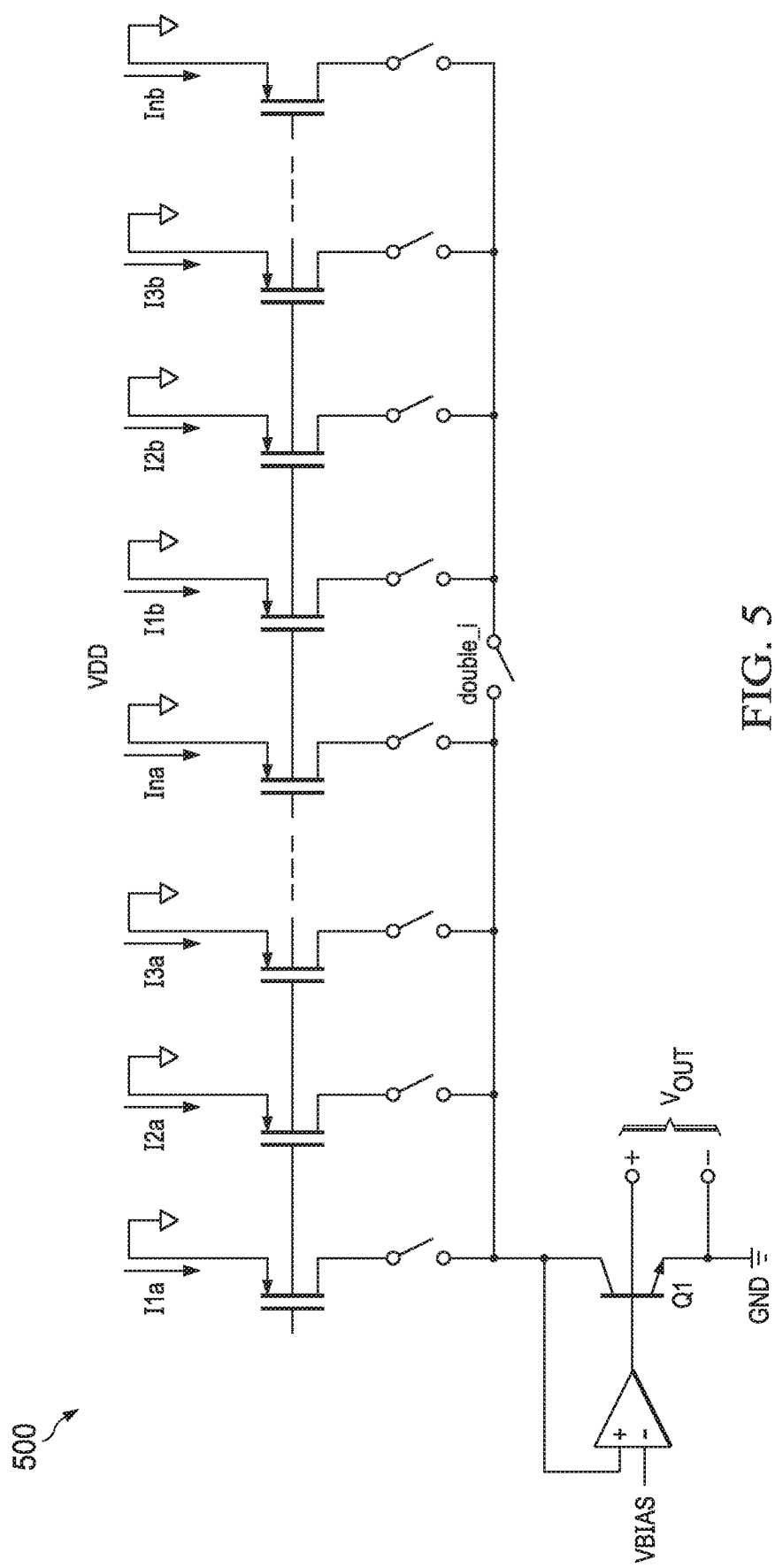
FIG. 5 is a schematic diagram of an example of a die temperature measurement circuit in the first configuration with Dynamic Element Matching (DEM) employed for collector current generation according to some embodiments.

FIG. 5 is a schematic diagram of an example of die temperature measurement circuit 500 in the first configuration with Dynamic Element Matching (DEM) employed for collector current generation. In some embodiments, a bank of DEM transistors, each capable of conducting a number of currents I1a-Ina and I1b-Inb, may be employed to achieve matching at a potentially lower area-usage, albeit with a larger number of measurements.

Compared with the previous circuits, circuit 500 uses simple (and small) MOSFET current sources to generate the collector currents. The MOSFETs may be identical devices. In some cases, each MOSFET conducts a unitary current ($I_{C\_un}$) when its switch is closed. For example, N switches may be closed to bias Q1 with collector current $Ic=NI_{C\_un}$.

Circuit 500 may also be sequentially configured to output $V_{B'E'1}$, $V_{B'E'2}$, $V_{B'E'N}$, and $V_{B'E'2N}$. Each $V_{B'E'}$ signal may be produced repeatedly, each time using a different set of unitary MOSFET current sources to generate the corresponding collector current, and results may be averaged using any suitable DEM technique. When applying DEM, the effect of MOSFET mismatch can be made negligible.

Additionally or alternatively, other current mirror implementations may be used such as MOS transistors with source-degeneration and/or with cascodes. Additionally or alternatively, different implementation for the switches may be used that prevent switching noise and swings during operation, without changing fundamentally the principle of operation of circuit 500. It should be noted that the use of feature(s) of circuit 500 may also be employed in combination with various other configurations described herein.

One or more of the systems and methods described herein may have voltage measurements done by the system (e.g., $V_{B'E'}$ voltages need to be measured in case of the first configuration). For field operation, an SoC may normally employ an on-chip ADC to make these voltage measurements. Then, the conversion results (already in digital form) may be processed by software to calculate die temperature; although hardware implementations may also be used.

For production-test, it is highly-desirable to also use an on-chip ADC to lower test cost: it reduces test time (external equipment normally requires much longer settling times), simplifies test procedures, favors parallelism, among other advantages. However, the use of the first configuration can impose measurement accuracy requirements that make it more appropriate for use with high-precision ADCs.

To illustrate, considering only errors due to ADC reference voltage and number of bits (quantization), the maximum relative error of the temperature measurement ($\delta T_{ERR}/T$) from Equation 5 is given by:

$$\frac{\delta T_{ERR}}{T} = 1 - \left(\frac{1}{1-(\delta V_{ADREF}/V_{ADREF})}\right) \cdot \left(1 + 6 \cdot \frac{(\delta V_{LSB/2})}{[2 \cdot (V_{B'E'N} - V_{B'E'1}) - (V_{B'E'2N} - V_{B'E'2I})]}\right) \quad \text{Equation 6}$$

where $\delta V_{ADREF}/V_{ADREF}$ is the maximum relative error of the ADC reference voltage ($V_{ADREF}$) and $\delta V_{LSB/2}$ is half the quantization step of the ADC. For production-test, the term $\delta V_{ADREF}/V_{ADREF}$ in Equation 6 may be neglected because ADC reference voltage $V_{ADREF}$ is commonly measured or provided using off-chip test resources. However, quantization errors can still pose problems.

To exemplify, based on Equation 6, a 16-bit ADC would be necessary under a 1.8 V supply for a maximum temperature measurement error of 0.33° C. due to quantization. However, several products only embed ADCs with lower number of bits (e.g., 12-bit) and hence would require a different solution. Accordingly, embodiments described below may enable the use of systems and methods described herein in a larger number of SoC products that embed moderate-precision ADCs (e.g., 12-bit), and deliver improved accuracy increasing signal-to-noise ratios.

Figure 6:
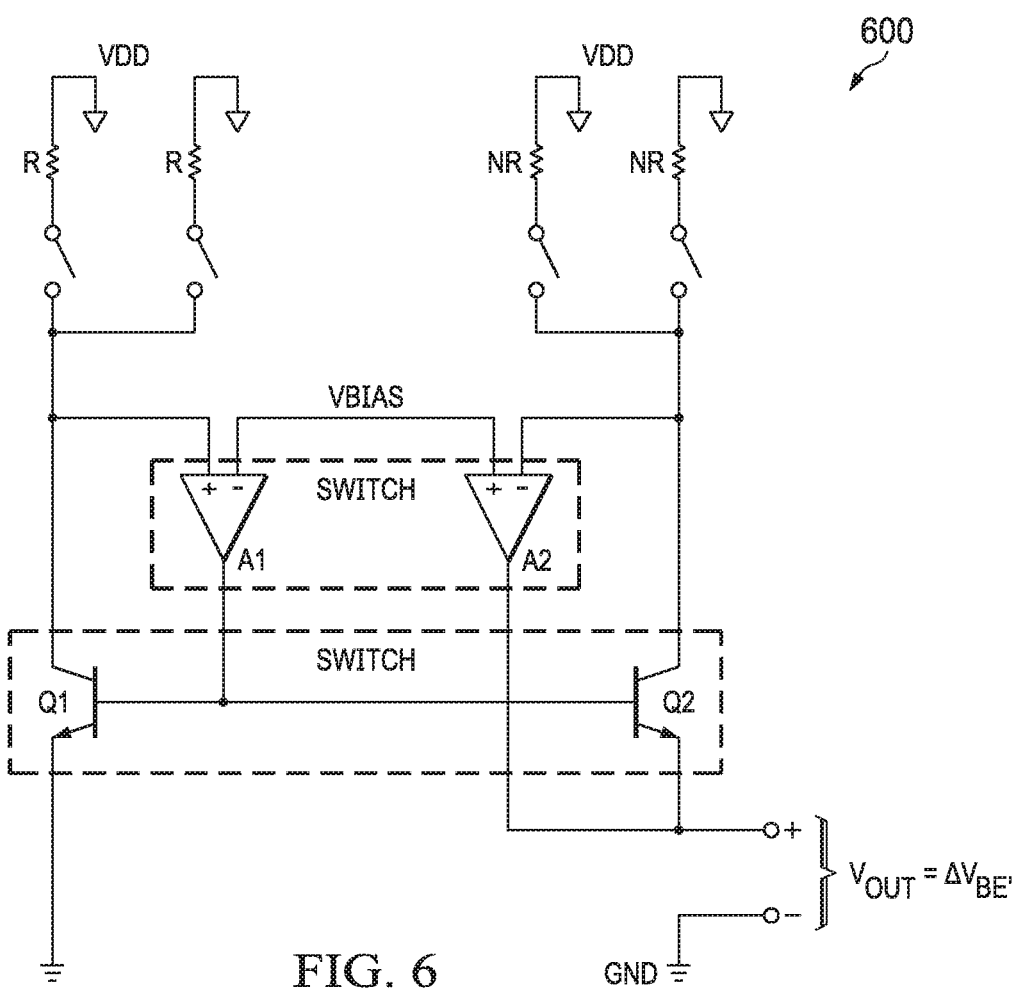
FIG. 6 is a schematic diagram of an example of a die temperature measurement circuit in a second configuration according to some embodiments.

FIG. 6 is a schematic diagram of an example of die temperature measurement circuit 600 in a second configuration according to some embodiments. As shown, system 600 includes a first plurality of resistors R (with series switches forming structures arranged in parallel) and a first BJT Q1 having: a first base terminal, a first collector terminal, and a first emitter terminal. The first collector terminal is coupled to the first plurality of resistors R, and each resistor is coupled to the first collector terminal via a corresponding one of a first plurality of corresponding switches.

System 600 may also include a second plurality of resistors NR (with series switches forming structures arranged in parallel) and a second BJT Q2 having: a second base terminal, a second collector terminal, and a second emitter terminal. The second base terminal is coupled to the first base terminal, the second collector terminal is coupled to the second plurality of resistors, the emitter terminal is coupled to a ground terminal, and each resistor is coupled to the second collector terminal via a corresponding one of a second plurality of corresponding switches.

System 600 may further include a first amplifier A1 having a first non-inverting input coupled to the first collector terminal, a first inverting input coupled to a bias node VBIAS, and a first output terminal coupled to the base terminals of transistors Q1 and Q2. Second amplifier A2 has a second inverting input coupled to the second collector terminal, a second non-inverting input coupled to a bias node VBIAS, and a second output terminal coupled to the second emitter terminal of BJT Q2.

The first plurality of resistors R may include a first resistor coupled to the first collector terminal under control of a first switch, where the first resistor is configured to conduct a first electrical current; and a second resistor coupled to the first collector terminal under control of a second switch, where the second resistor is configured to conduct the first electrical current. Moreover, the second plurality of resistors may include a third resistor coupled to the second collector terminal under control of a third switch, where the third resistor is configured to conduct a second electrical current; and a fourth resistor coupled to the second collector terminal under control of a fourth switch, where the fourth resistor is configured to conduct the second electrical current.

The output voltage of circuit 600 is provided between the second emitter terminal (of second BJT Q2) and the ground terminal. In this case, logic circuit 210 may be configured to determine a temperature based upon combining the output voltage values of circuit 600 obtained for different collector current (switch) configurations. For example, logic circuit 210 may be configured to determine the temperature, at least in part, based upon a ratio N between: (i) a product of a first collector current of the first BJT Q1 and a second collector area of the second BJT Q2, and (ii) a product of a second collector current of the second BJT Q2 and a first collector area of the first BJT Q1.

An output voltage equal to $\Delta V_{B'E'(2)1} = V_{B'E'(2NI)NI} - V_{B'E'(2I)I}$ is generated, such that the subtraction is done in the analog domain. Therefore, the signals to be measured are $\Delta V_{B'E'1}$ and $\Delta V_{B'E'2}$, and temperature expression becomes:

$$T = \frac{q}{k\ln(N)} \cdot (2 \cdot \Delta V_{B'E'1} - \Delta V_{B'E'2}) \qquad \text{Equation 7}$$

The error components due to mismatch between Q1 and Q2 and between A1 and A2 input offsets (if not acceptable) may be cancelled out by taking the average of measurements done before and after switching the BJTs and switching the amplifier input circuitry that mainly determines their input offset (e.g., input differential pair, or the entire first-stage, etc.). After that, the remaining error components are equivalent to those of circuit 300. Therefore, virtually no extra error comes from the inclusion of the second BJT and second amplifier. Alternatively, calibration performed at a single temperature point is very effective in reducing that error source.

The expression of measurement error due to the ADC becomes:

$$\frac{\delta T_{ERR}}{T} = 1 - \qquad \text{Equation 8}$$

$$\left(\frac{1}{1 - (\delta V_{VADREF}/V_{ADREF})}\right) \cdot \left(1 + 3 \cdot \frac{\delta V_{LSB/2}}{(2 \cdot \Delta V_{B'E'1} - \Delta V_{B'E'2})}\right)$$

Note that Equation 8 indicates half the error due to quantization compared to Equation 6, because it involves half the number of analog-to-digital conversions.

Figure 7:
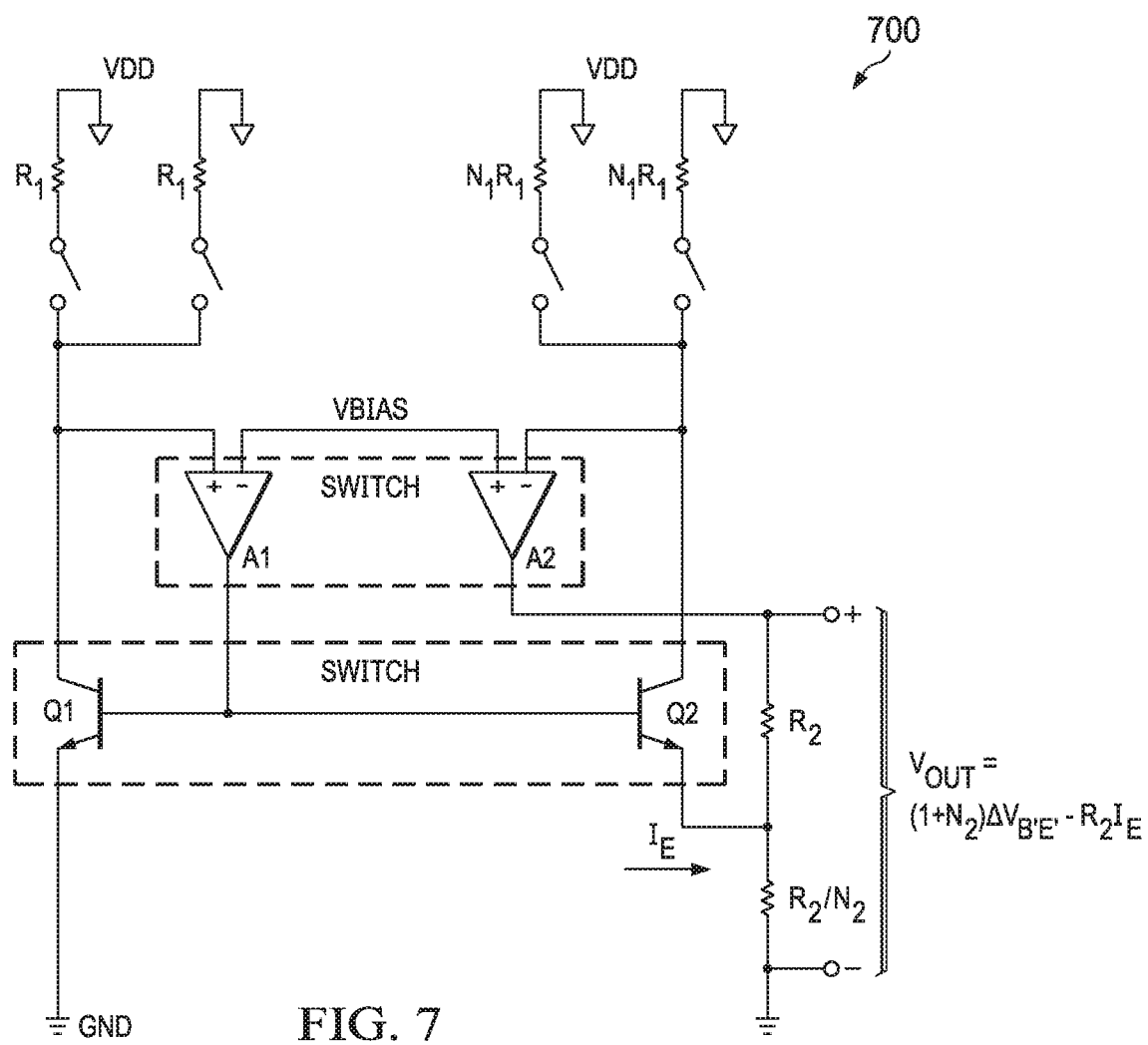
FIG. 7 is a schematic diagram of an example of a die temperature measurement circuit in a third configuration according to some embodiments.

FIG. 7 is a schematic diagram of an example of a die temperature measurement circuit 700 in a third configuration according to some embodiments. In system 700, the second output terminal of second amplifier A2 is coupled to the second emitter terminal via a first output resistor $R_2$, and the second emitter terminal of second BJT Q2 is coupled to the ground terminal via a second output resistor $R_2/N_2$ coupled to the ground terminal. In this case, the output voltage of system 700 is provided between the second output terminal and the ground terminal.

In summary, system 700 employs resistors in an output feedback portion to amplify $\Delta V_{B'E'}$ as better fit for the input range of the measurement apparatus. The temperature expression becomes:

$$T = \frac{1}{(1+N_2)} \cdot \frac{q}{k\ln(N)} \cdot (2 \cdot V_{OUT1} - V_{OUT2}) \qquad \text{Equation 10}$$

where $V_{OUT1}$ and $V_{OUT2}$ are the outputs measured for BJT currents (NI, I) and (2NI, 2I), respectively. Note that the term dependent on $I_E$ at the output voltage is cancelled out (together with the effect of BJT terminal resistances) through the 4-current method.

Alternatively, a resistor equal to $R_2/(N_2+1)$ may be included between the first BJT's emitter terminal and the ground terminal to eliminate the term dependent on $I_E$ at the output voltage. With such a modification, $V_{OUT} = (1+N_2) \sim \Delta V_{B'E'}$. However, because the 4-current method already cancels out the effect of $I_E$, such a resistor is not always necessary.

The expression of measurement error due to the ADC becomes:

$$\frac{\delta T_{ERR}}{T} = 1 - \left(\frac{1}{1 - (\delta V_{VADREF}/V_{ADREF})}\right) \cdot \qquad \text{Equation 11}$$

$$\left(1 + 3 \cdot \frac{\delta V_{LSB/2}}{(1+N_2) \cdot (2 \cdot \Delta V_{B'E'1} - \Delta V_{B'E'2})}\right)$$

Note that the error term related to ADC resolution step is divided by the $\Delta V_{B'E'}$ gain factor $(1+N_2)$. This allows moderate-precision ADCs (e.g., 12-bit) to be used for highly-accurate temperature measurements. For example, choosing $N_2=12.25$, a 12-bit ADC would be necessary under a 1.8 V reference for a maximum temperature measurement error of 0.2° C. due to quantization. The $\Delta V_{B'E'}$ gain factor depends solely on resistor matching and therefore can be made very accurate. Accordingly, a 12-bit ADC may be used, for example, to achieve target accuracies of +/−1° C. for production-test applications and +/3° C. for field applications.

Figure 8:
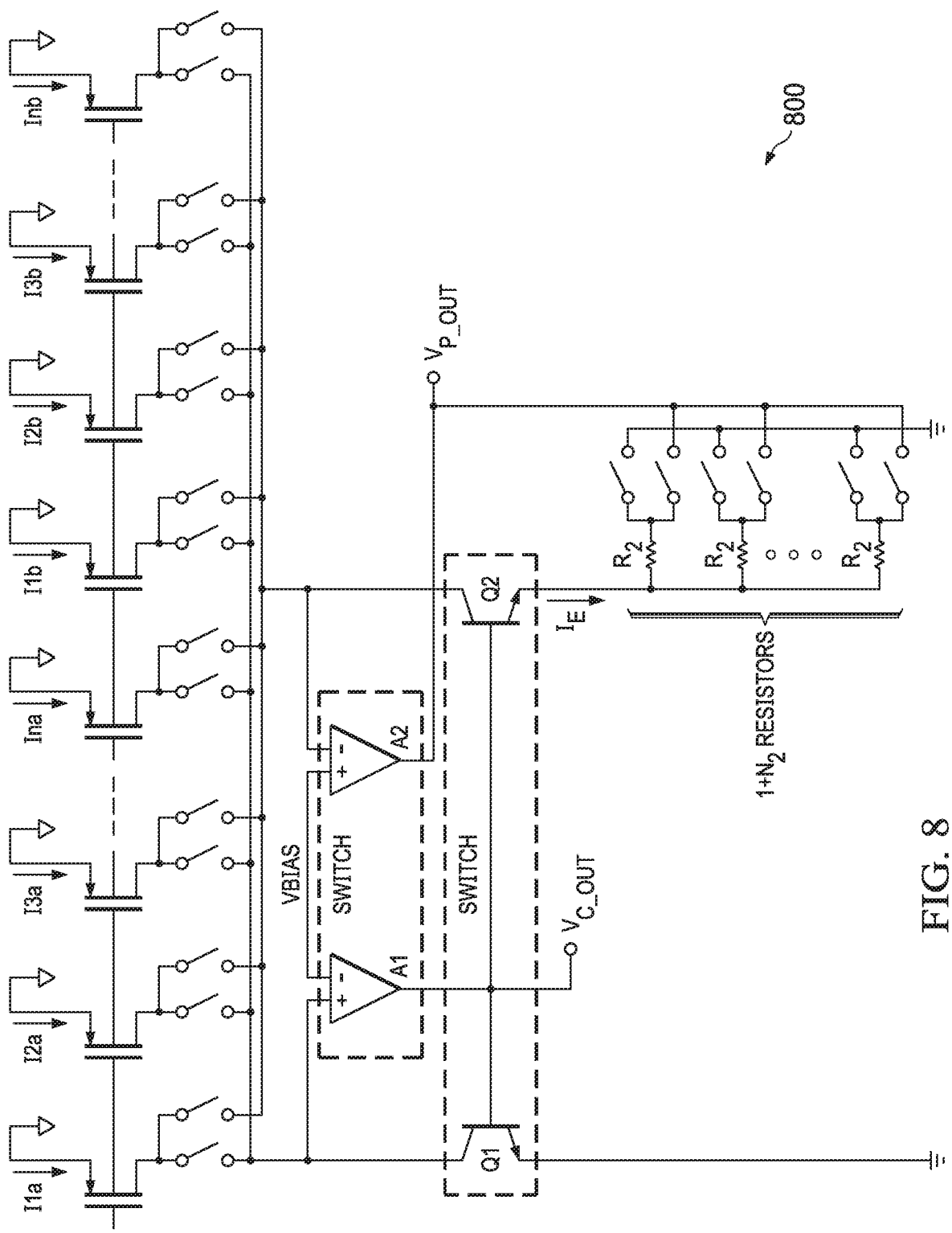
FIG. 8 is a schematic diagram of an example of a die temperature measurement circuit in the third configuration with Dynamic Element Matching (DEM) applied in a feedback network according to some embodiments.

FIG. 8 is a schematic diagram of an example of a die temperature measurement circuit 800 in the third configuration with DEM. In some embodiments, 1+$N_2$ resistors may be used in a feedback network to eliminate gain sensitivity to resistor mismatch. Particularly, output $V_{OUT}$ may be repeatedly measured each time with a different unitary $R_2$ resistor connected to the $V_{OUT}$ node (while the other $R_2$ resistors were connected to ground). Note that DEM may be also be applied on the collector current generation in a similar manner as described for circuit 500.

As previously noted, for factory-test applications, the voltage reference used by the ADC ($V_{ADREF}$) may be precisely measured using external test instrumentation. This eliminates errors associated with $V_{ADREF}$ uncertainty and therefore allows the on-chip ADC to be used as a fast and accurate "test resource". For field operation where $V_{ADREF}$ may not be precisely known, a second (independent) temperature-related signal may be provided for cancelling out any dependence to the ADC reference level.

As such, systems and methods described herein provide a $V_{B'E'}$ voltage as a second temperature-related signal. Note that signals $V_{BE}$ and $\Delta V_{BE}$ are components of a Bandgap Reference voltage and other temperature-related signal or circuit. Systems and methods embodiments described herein already provide this second output signal ($V_{B'E'}$) at the base node of the NPN BJTs, as exemplified in FIG. 9.

Figure 9:
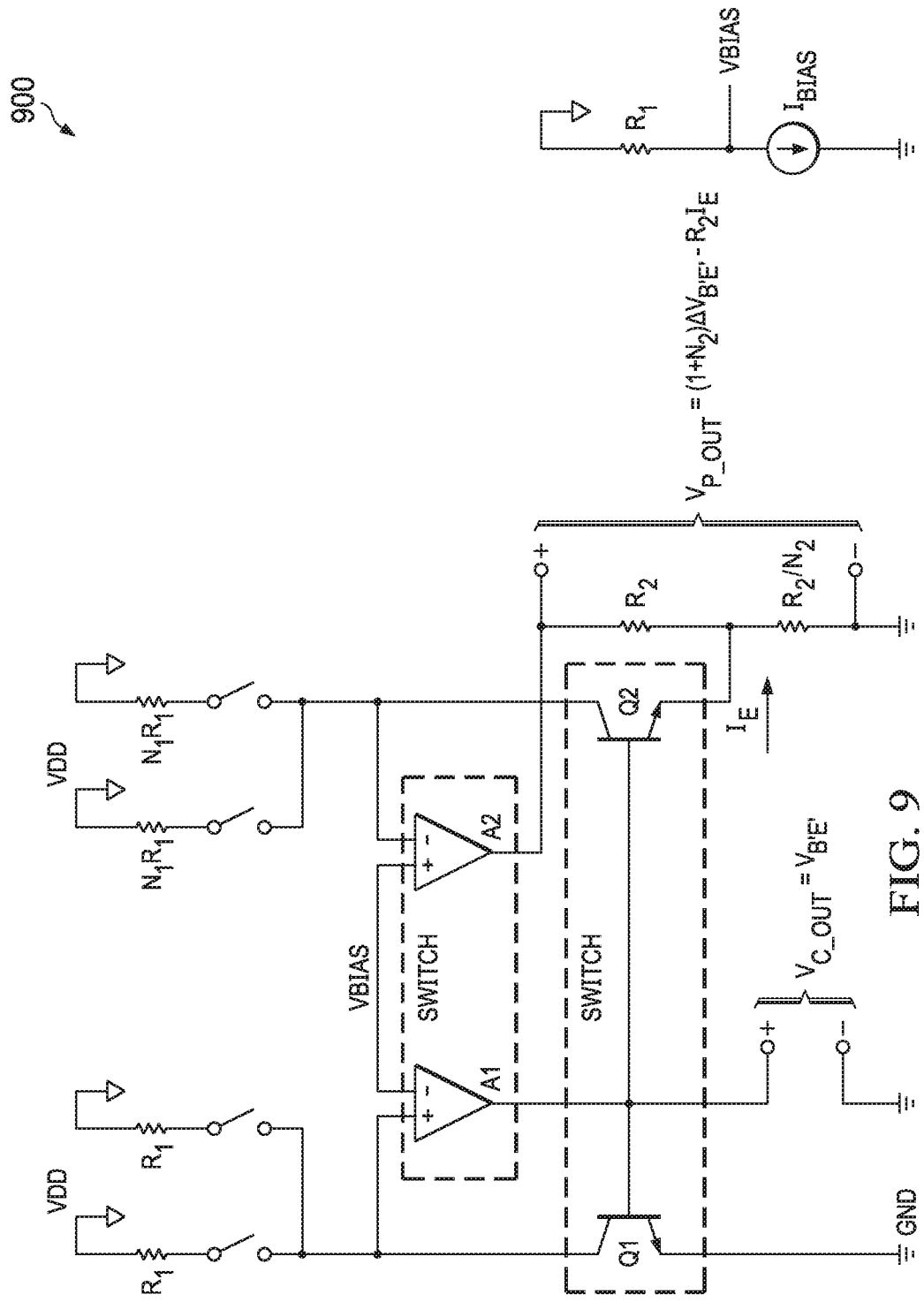
FIG. 9 is a schematic diagram of an example of a die temperature measurement circuit in the third configuration with two outputs according to some embodiments.

FIG. 9 is a schematic diagram of an example of a die temperature measurement circuit 900 in the third configuration with two outputs. In this embodiment, $V_{P\_OUT}$ is the output signal related to $\Delta V_{BE}$ (normally called "PTAT" term) and $V_{C\_OUT}$ $V_{C\_OUT}$ is the output related to $V_{BE}$ (normally called "CTAT" term). Note that the effect of BJT terminal resistances on $V_{C\_OUT}$ is also cancelled out by applying the 4-current method. By taking the ratio between the AD conversion results of $V_{P\_OUT}$ and $V_{C\_OUT}$, the dependence on $V_{ADREF}$ is eliminated. Die temperature is then extracted directly in function of the ($V_{P\_OUT}/V_{C\_OUT}$) ratio.

The temperature relationship to be used depends on $V_{BE}$ thermal behavior, which in turn depends on biasing current thermal behavior. In some cases, systems and methods described herein may combine $V_{BE}$ voltages generated with currents of different thermal profiles to cancel out second-order effects (reference voltage temperature curvature). A procedure to accomplish that is represented below with two $I_{BIAS}$ options employed: $I_{BIAS}=I_{PTAT}$ (a Proportional to The-Absolute Temperature or "PTAT" bias current—i.e., a current proportional to the absolute temperature) and $I_{BIAS}=I_{ZTC}$ (a constant current, i.e., with negligible thermal variation).

Figure 10:
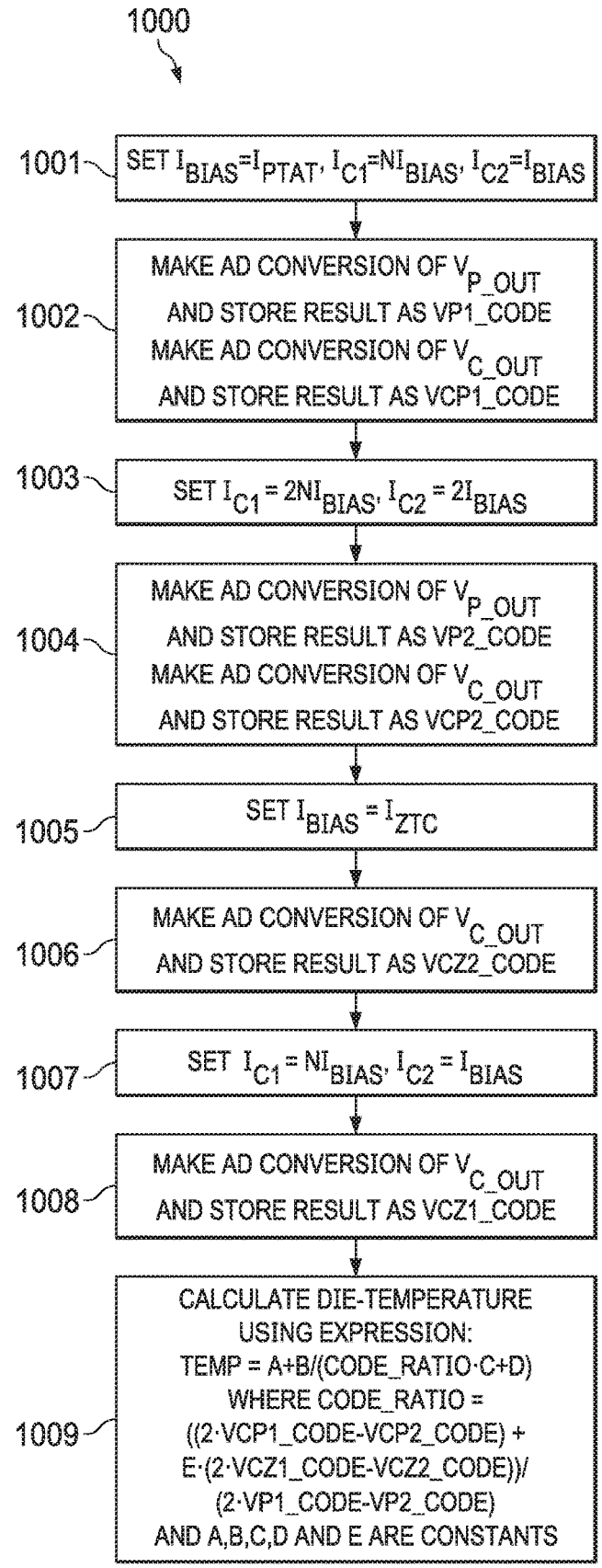
FIG. 10 is a flowchart of an example of a method for measuring die temperature while canceling second-order effects (curvature-compensation) according to some embodiments.

FIG. 10 is a flowchart of an example of method 1000 for measuring die temperature while canceling second-order effects (curvature-compensation). In some embodiments, method 1000 may be performed, at least in part, by logic circuit 210.

At block 1001, method 1000 sets a bias current to a PTAT value, sets a first collector current to a value proportional to the PTAT value, and sets a second collector current to the PTAT value. At block 1002, method 1000 measures the first output voltage and stores it as a first value; and measures the second output voltage and stores it as a second value.

At block 1003, method 1000 sets the first collector current to twice the value proportional to the PTAT value, and sets a second collector current to twice the PTAT value. At block 1004, method 1000 measures the first output voltage and storing it as a third value, and measures the second output voltage and storing it as a fourth value.

At block 1005, method 1000 sets the bias current to a Zero Temperature Coefficient (ZTC) value. At block 1006, method 1000 measures the second output voltage and stores it as a fifth value. At block 1007, method 1000 sets the first collector current to the value proportional to the ZTC value, and sets the second collector current to the ZTC value. At block 1008, method 1000 measures the second output voltage and stores it as a sixth value.

Finally, at block 1009, method 1000 calculates a temperature of the die as: A+B/(ratio×C+D), where the ratio is given by: ((2×second value−fourth value)+E×(2×sixth value−fifth value))/(2×first value−third value), and where A, B, C, D, and E are constants.

If errors due to VBE curvature are acceptable, method 1000 may be simplified by not cancelling the VBE curvature effect, such that only one type of BIAS current is necessary, a lower number of measurements is needed, and so on.

The Early-effect of BJT transistors is typically not considered significant based on the observation that $V_{CB}$ has little variation between the different collector current configurations, and hence Early-effect should cause negligible accuracy loss. If for any given technology Early-effect does represent a significant error contributor, embodiments previously discussed may be modified by maintaining $V_{CB}$ voltage unchanged between the different collector current configurations, as shown in FIGS. 11 and 12.

Figure 11:
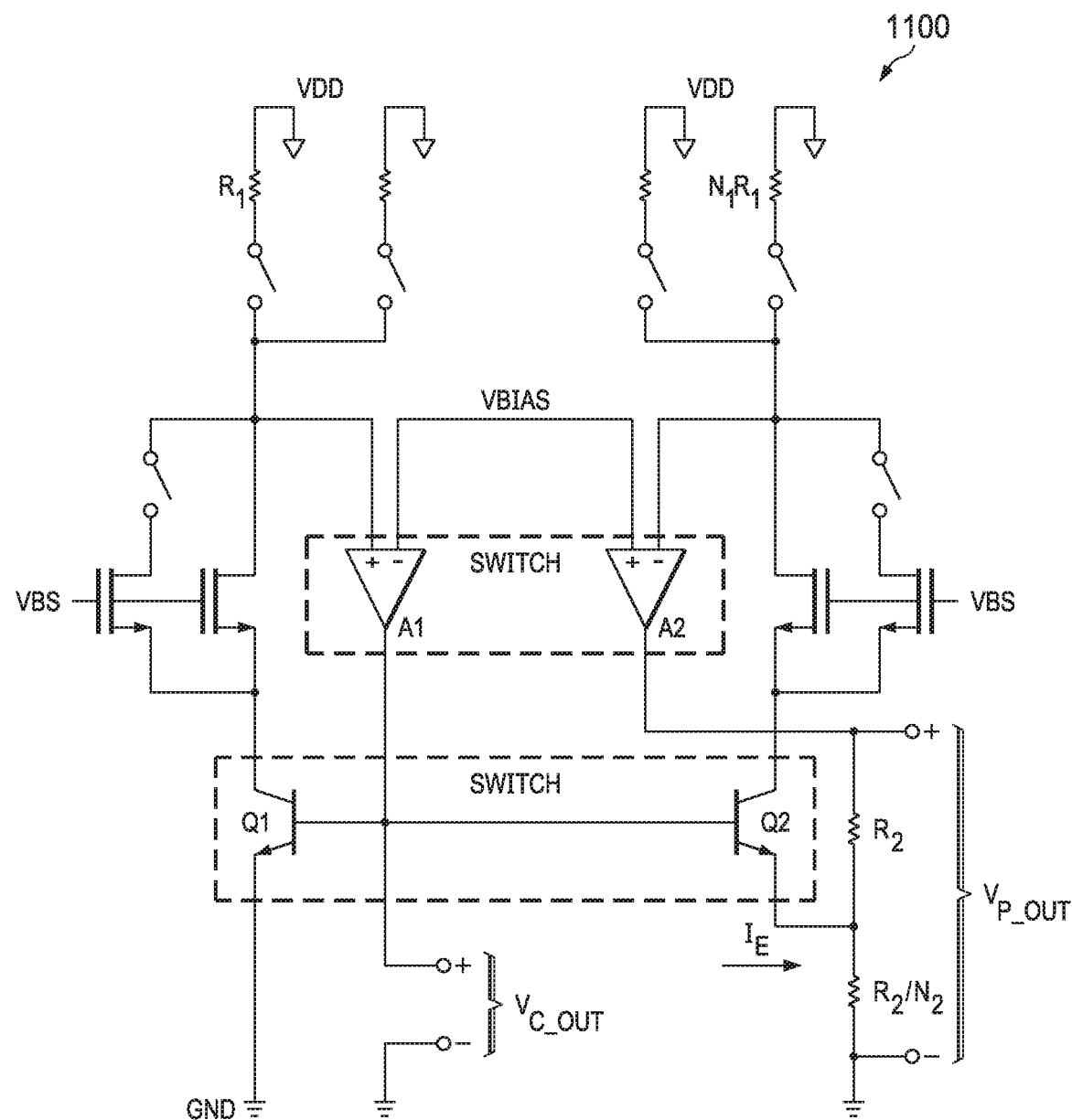
FIG. 11 is a schematic diagram of an example of a die temperature measurement circuit in the third configuration with cascodes according to some embodiments.
Figure 12:
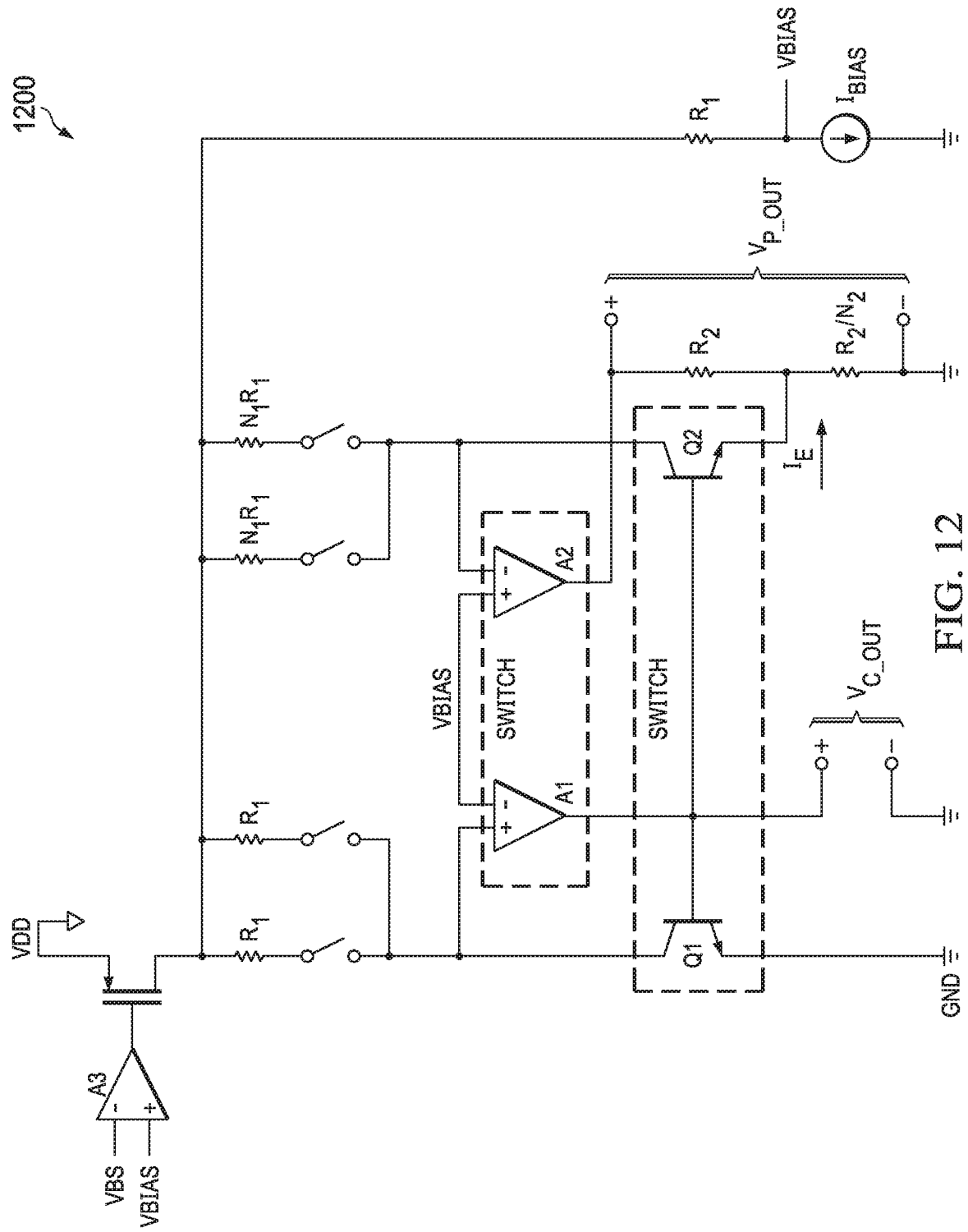
FIG. 12 is a schematic diagram of an example of a die temperature measurement circuit in the third configuration with feedback-control of top-rail voltage according to some embodiments.

FIG. 11 is a schematic diagram of an example of die temperature measurement circuit 1100 in the third configuration with cascodes. FIG. 12 is a schematic diagram of an example of die temperature measurement circuit 1200 in the third configuration with feedback-control of top-rail voltage.

In system 1100, the first plurality of resistors is coupled to the first collector terminal via a first cascode circuit driven by a voltage VBS and the second plurality of resistors is coupled to the second collector terminal via a second cascode circuit driven by vbs. In system 1100, the non-inverting input of A3 may alternatively be connected to either BJT collector node.

In both systems 1100 and 1200, vbs represents a copy of the BJTs base terminal voltage shifted by some amount. In some cases, vbs may be directly connected to the BJT base node. In both examples, the $V_{BC}$ voltage of the BJTs is kept the same after collector currents are changed. That is, BJT collector potentials track changes in base potential. It should be noted that the use of feature(s) of circuits 1100 and/or 1200 may also be employed in combination with various other configurations described herein In general, over-sampling ADCs may be used to make the addition and subtraction operations of the voltage signals produced by certain embodiments. For example, to obtain the quantity ($2\Delta V_{BE'1}-\Delta V_{BE'2l}$) directly in a digital form, logic circuit 210 may continuously change the voltage to be sampled following the sequence $\Delta V_{BE'1}$, $\Delta V_{BE'1}$, and $-\Delta V_{BE'2l}$ (opposite polarity). Then, the conversion result, which represents the low-frequency component of a varying input signal (average), is representative of the quantity ($2\Delta V_{BE'1}-\Delta V_{BE'2l}$).

Figure 13:
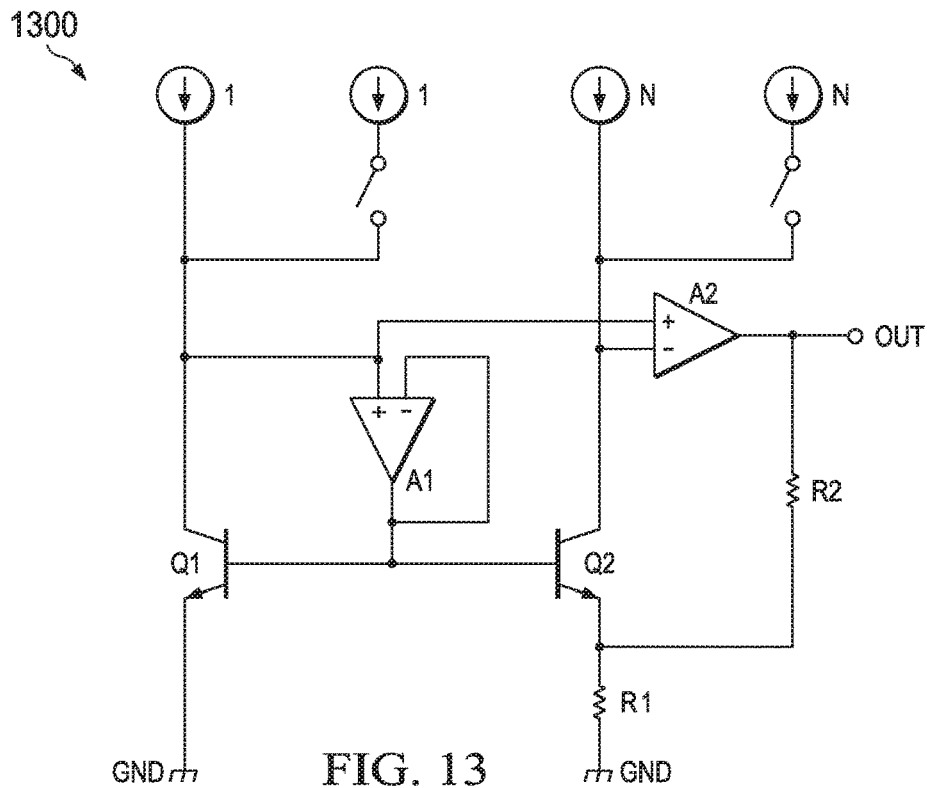
FIG. 13 is a schematic diagram of an example of a die temperature measurement circuit in a configuration without a bias voltage according to some embodiments.

FIG. 13 is a schematic diagram of an example of a die temperature measurement circuit in a configuration without a bias voltage. In various embodiments, circuit 1300 implements current sources, does not require Vbias, but otherwise operates similarly to circuits 1100 and 1200 (of FIGS. 11 and 12).

Figure 14:
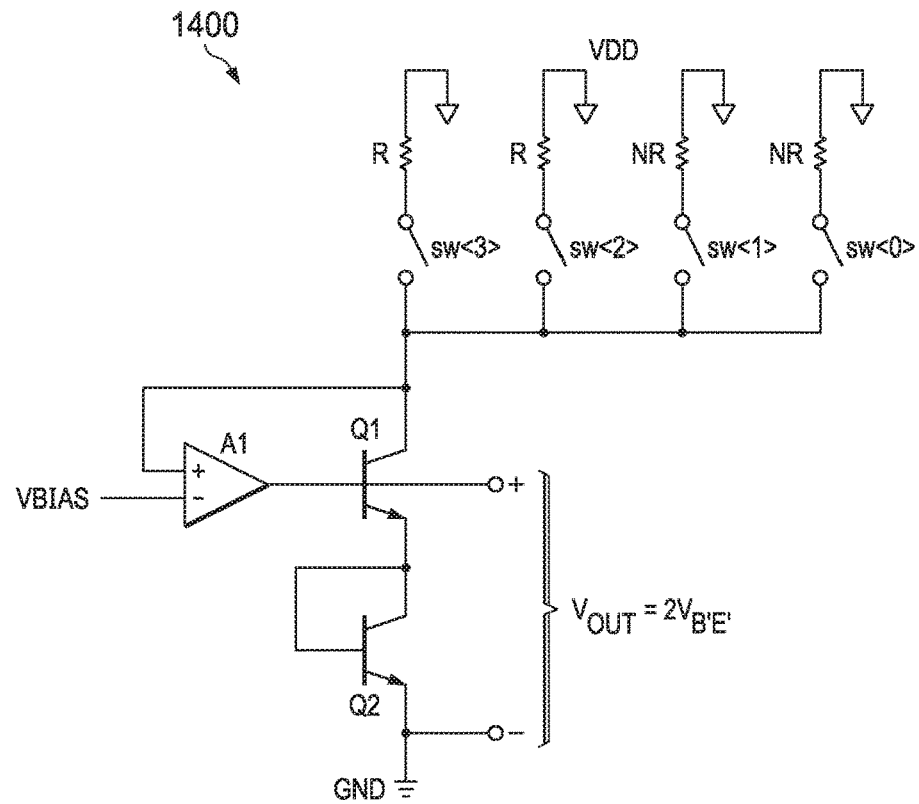
FIG. 14 is a schematic diagram of an example of a die temperature measurement circuit in the first configuration with stacked BJTs according to some embodiments.

Finally, FIG. 14 is a schematic diagram of an example of die temperature measurement circuit 1400 in the first configuration with stacked BJTs. In some embodiments, a minimum voltage supply headroom may be required for operation. If enough voltage headroom is available, BJTs Q1 and Q2 may be stacked to increase gain without adding error.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A temperature sensor, comprising:
    a first plurality of resistors;
    a first Bipolar Junction Transistor (BJT) having: a first base terminal, a first collector terminal, and a first emitter terminal, wherein the first collector terminal is coupled to the first plurality of resistors, wherein the first emitter terminal is coupled to a ground terminal, and wherein each resistor is coupled to the first collector terminal via a corresponding one of a first plurality of corresponding switches;
    a first amplifier having a first non-inverting input coupled to the first collector terminal and a first output terminal coupled to the first base terminal;
    a second plurality of resistors;
    a second BJT having: a second base terminal, a second collector terminal, and a second emitter terminal, wherein the second base terminal is coupled to the first base terminal, wherein the second collector terminal is coupled to the second plurality of resistors, and wherein each resistor is coupled to the second collector terminal via a corresponding one of a second plurality of corresponding switches; and
    a second amplifier having a second inverting input coupled to the second collector terminal and a second output terminal coupled to the second emitter terminal, wherein a first inverting input terminal of the first amplifier is coupled to a second non-inverting input terminal of the second amplifier, and wherein a first output voltage of the temperature sensor is provided between the second output terminal of the second amplifier and the ground terminal, and wherein the first output voltage is temperature-dependent on a temperature of an integrated circuit containing the temperature sensor.

2. The temperature sensor of claim 1, wherein the first inverting input terminal of the first amplifier and the second non-inverting input terminal of the second amplifier are coupled to a same bias voltage rail.

3. The temperature sensor of claim 1, wherein the first plurality of resistors further comprises:
    a first resistor coupled to the first collector terminal under control of a first switch, wherein the first resistor is configured to conduct a first electrical current; and
    a second resistor coupled to the first collector terminal under control of a second switch, wherein the second resistor is configured to conduct the first electrical current.

4. The temperature sensor of claim 3, wherein the second plurality of resistors further comprises:
    a third resistor coupled to the second collector terminal under control of a third switch, wherein the third resistor is configured to conduct a second electrical current; and
    a fourth resistor coupled to the second collector terminal under control of a fourth switch, wherein the fourth resistor is configured to conduct the second electrical current.

5. The temperature sensor of claim 1, wherein a second output voltage of the temperature sensor is provided between the first output terminal of the first amplifier and the ground terminal.

6. The temperature sensor of claim 1, wherein the second output terminal is coupled to the second emitter terminal via a first output resistor, wherein the second emitter terminal is coupled to the ground terminal via a second output resistor coupled to the ground terminal.

7. The temperature sensor of claim 1, further comprising:
    a logic circuit coupled to receive the first output voltage of the temperature sensor and configured to determine a first temperature value of the integrated circuit based upon voltage values of the first output voltage measured using different values of a first collector current of the first BJT and a second collector current of the second BJT.

8. The temperature sensor of claim 5, further comprising:
    a logic circuit coupled to receive the first and second output voltages of the temperature sensor and configured to determine a first temperature value of the temperature of the integrated circuit based upon voltage values of the first and second output voltages.

9. The temperature sensor of claim 8, wherein the logic circuit is configured to:
    set a bias current to a Proportional-To-the-Absolute-Temperature (PTAT) value, set a first collector current for the first BJT to a value proportional to the PTAT value, and setting a second collector current for the second BJT to the PTAT value;
    measure the first output voltage and storing it as a first value; and
    measure the second output voltage and storing it as a second value.

10. The temperature sensor of claim 9, wherein the logic circuit is further configured to:
    set the first collector current to twice the value proportional to the PTAT value, and set the second collector current to twice the PTAT value;
    measure the first output voltage and storing it as a third value; and
    measure the second output voltage and storing it as a fourth value.

11. The temperature sensor of claim 10, wherein the logic circuit is further configured to:
    setting set the bias current to a Zero Temperature Coefficient (ZTC) value;
    measure the second output voltage and storing it as a fifth value;
    set the first collector current to the value proportional to the ZTC value, and set the second collector current to the ZTC value; and
    measure the second output voltage and storing it as a sixth value.

12. The temperature sensor of claim 11, wherein the logic circuit is further configured to determine the first temperature value as: A+B/(ratio×C+D), wherein the ratio is given by: ((2×second value fourth value)+E×(2×sixth value fifth value))/(2×first value−third value), and wherein A, B, C, D, and E are constants.

13. The temperature sensor of claim 12, wherein obtaining the first temperature value with the first, second, third, fourth, fifth, and sixth values corresponds to a measurement sequence, and the logic circuit is configured to offset an error due to a die temperature drift during the measurement sequence, in part, by repeating the measurement sequence in reverse-order to obtain a second temperature value of the temperature of the integrated circuit and averaging two or more temperature values.

14. The temperature sensor of claim 12, wherein the first inverting input terminal of the first amplifier and the second non-inverting input terminal of the second amplifier are coupled to a same bias voltage rail.

15. An integrated circuit (IC), comprising:
a controller; and
a temperature sensor coupled to the controller, the temperatures sensor comprising:
  a first plurality of resistors;
  a first Bipolar Junction Transistor (BJT) having: a first base terminal, a first collector terminal, and a first emitter terminal, wherein the first collector terminal is coupled to the first plurality of resistors, wherein the first emitter terminal is coupled to a ground terminal, and wherein each resistor is coupled to the first collector terminal via a corresponding one of a first plurality of corresponding switches;
  a first amplifier having a first non-inverting input coupled to the first collector terminal and a first output terminal coupled to the first base terminal;
  a second plurality of resistors;
  a second BJT having: a second base terminal, a second collector terminal, and a second emitter terminal, wherein the second base terminal is coupled to the first base terminal, wherein the second collector terminal is coupled to the second plurality of resistors, and wherein each resistor is coupled to the second collector terminal via a corresponding one of a second plurality of corresponding switches; and
  a second amplifier having a second inverting input coupled to the second collector terminal and a second output terminal coupled to the second emitter terminal, wherein a first inverting input terminal of the first amplifier is coupled to a second non-inverting input terminal of the second amplifier, and wherein an output voltage of the temperature sensor is provided between the second emitter terminal and the ground terminal, and wherein the output voltage is temperature-dependent on a temperature of the integrated circuit.

16. The IC of claim 15, wherein the first inverting input terminal of the first amplifier is coupled to a second non-inverting input terminal of the second amplifier are coupled to a same bias voltage rail.

17. The IC of claim 16, wherein:
the first plurality of resistors comprises: a first resistor coupled to the first collector terminal under control of a first switch, wherein the first resistor is configured to conduct a first electrical current; and a second resistor coupled to the first collector terminal under control of a second switch, wherein the second resistor is configured to conduct the first electrical current; and
the second plurality of resistors further comprises: a third resistor coupled to the second collector terminal under control of a third switch, wherein the third resistor is configured to conduct a second electrical current; and a fourth resistor coupled to the second collector terminal under control of a fourth switch, wherein the fourth resistor is configured to conduct the second electrical current.

18. The IC of claim 15, wherein the controller is configured to determine the temperature based upon voltage values of the output voltage.

19. The IC of claim 18, wherein the voltage values of the output voltage are measured using different values of a first collector current of the first BJT and a second collector current of the second BJT.

20. The IC of claim 15, wherein the second output terminal is coupled to the second emitter terminal via a first output resistor, wherein the second emitter terminal is coupled to the ground terminal via a second output resistor coupled to the ground terminal, and wherein an output voltage of the temperature sensor is provided between the second amplifier output and ground.

* * * * *